(12) United States Patent
Ogura et al.

(10) Patent No.: US 6,703,130 B2
(45) Date of Patent: Mar. 9, 2004

(54) SUBSTRATE COATED WITH TRANSPARENT CONDUCTIVE FILM AND MANUFACTURING METHOD THEREOF

(75) Inventors: Morio Ogura, Hirakata (JP); Tatsuro Usuki, Osaka (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 10/234,198

(22) Filed: Sep. 5, 2002

(65) Prior Publication Data

US 2003/0059625 A1 Mar. 27, 2003

(30) Foreign Application Priority Data

Sep. 7, 2001 (JP) ........................................ 2001-272787

(51) Int. Cl.[7] .............................................. B32B 15/00
(52) U.S. Cl. ..................... 428/432; 428/435; 428/697; 428/702; 428/690; 428/704; 428/913
(58) Field of Search .................. 428/690, 704, 428/913, 432, 435, 697, 702

(56) References Cited

U.S. PATENT DOCUMENTS 5,247,190 A * 9/1993 Friend et al. .................. 257/40
6,268,695 B1 * 7/2001 Affinito ........................ 313/504

FOREIGN PATENT DOCUMENTS

| JP | 5-171437 | 7/1993 |
| JP | 6-172981 | 6/1994 |
| JP | 11-279756 | 10/1999 |

* cited by examiner

*Primary Examiner*—Deborah Jones
*Assistant Examiner*—Ling Xu
(74) *Attorney, Agent, or Firm*—Westerman, Hattori, Daniels & Adrian, LLP

(57) ABSTRACT

A substrate coated with a transparent conductive film is manufactured by: disposing a substrate 3 and a target 5 constituted of alloy of In and Sn in a film deposition chamber 1; leading an Ar gas ion beam into the film deposition chamber 1, to cause collision of the ion beam with the target 5, sputtering-emission of constitutive atoms of the target 5, and supply of the emitted atoms to the substrate 3; and leading oxide gas including oxygen radicals as a main element thereof from an ECR radical source 6 into the film deposition chamber 1, to deposit an ITO film 9 on the substrate 3. In this manufacturing method, a film is deposited on a film or substrate including an organic material without damaging the organic material. The deposited film has low resistivity, high transmission and preferable flatness.

14 Claims, 13 Drawing Sheets

LIGHT

SUBSTRATE COATED WITH TRANSPARENT CONDUCTIVE FILM AND MANUFACTURING METHOD THEREOF

BACKGROUND OF THE INVENTION

1. Field of the Invention

The present invention relates to a substrate coated with a transparent conductive film, such as indium oxide with tin doped therein (ITO), to be used for a liquid crystal display apparatus, a solar battery or the like, and to a method for manufacturing the coated substrate.

2. Description of Related Art

A substrate such as a glass substrate which has a transparent conductive film deposited thereon, such as ITO, zinc oxide (ZnO) and tin oxide ($SnO_2$), is used for a display apparatus such as an LCD (Liquid Crystal Display) and an EL (Electro Luminescence) apparatus, a photovoltaic apparatus such as a solar battery and an optical sensor, a semi-conductor apparatus such as a TFT (Thin Film Transistor), and an optical communication apparatus such as a light modulator and an optical switch.

In particular, the ITO film, which has properties of high visible spectrum transmission and low resistivity, is widely used as a transparent electrode of a flat-panel display such as a liquid crystal display element, a solar battery or the like.

Conventionally, an ITO film is deposited on a glass substrate by vacuum evaporation coating or sputtering, at a substrate temperature between 300 and 400° C. When a transparent conductive film is deposited by DC (Direct Current) sputtering, DC magnetron sputtering, RF (Radio Frequency) magnetron sputtering or the like, the substrate and film are exposed to plasma of sputtering gas such as rare gas. Consequently, there may arise a problem that the substrate and film are damaged by high speed particles and negative ions in plasma colliding with or entering the substrate and film, and thereby the formed film has physical properties of high resistivity and low transmission. In order to evade the above problem a film is deposited at a substrate temperature between 300 and 400° C., since it is believed that this method leads to preferable crystallinity, and thereby to low resistivity and high transmission of the obtained film.

In recent years, there is need for a film deposition art for depositing a transparent conductive film on a film including an organic material, such as a polymer film, deposited on a glass substrate. Moreover, needed is a film deposition art for depositing a transparent conductive film on a substrate made of an organic material, such as polyimide, which is selected for the purpose of reduction of device weight. There is, however, a problem that, when the substrate includes an organic material, the substrate temperature cannot be raised to 300 through 400° C. in order to evade decomposition of the organic material which has a low temperature limit for heat-resistance in vacuum. Being deposited at a low temperature, a film or a substrate including an organic material is damaged by plasma and the crystallinity of a transparent conductive film deposited thereon is lowered, causing undesirable physical properties of the film or substrate. Caused as a result is deterioration in quality of the substrate coated with a transparent conductive film.

Moreover, required is a flatter transparent conductive film to be deposited on a substrate, which constructs a luminous element such as an EL element, a component for optical communication such as a light modulator and an optical switch, or the like. For instance, according to a thin film EL element which has a transparent conductive film, an insulating layer, a luminescent layer, another insulating layer and an Al electrode deposited on a glass substrate in this order, roughness of the surface of the transparent conductive film causes roughness of the surface of each layer formed thereon, prevents uniform light emission from the luminescent layer, and causes dielectric breakdown due to an electric field which is not applied uniformly. In order to solve the above problems, flat transparent conductive film has been desired.

BRIEF SUMMARY OF THE INVENTION

The present invention has been made with the aim of solving the above problem, and it is an object thereof to provide a substrate coated with a transparent conductive film and a manufacturing method thereof, in which a film with low resistivity, high transmission and preferable flatness is deposited on a film or substrate including an organic material, without damaging the organic material.

Another object of the invention is to provide a substrate coated with a transparent conductive film with still higher transmission and lower resistivity, which can be used for a flat-panel display such as an liquid crystal display element, a solar battery or the like.

Still another object of the invention is to provide a method for manufacturing a substrate coated with a transparent conductive film by which proper oxidation level of metal is achieved, and the obtained transparent conductive film has high transmission, low resistivity and preferable flatness.

A substrate coated with a transparent conductive film according to the present invention comprises a substrate and a transparent conductive film including an oxide of metal or alloy, which film is deposited on the substrate, wherein the transparent conductive film is deposited by: disposing a substrate and a target including metal or alloy in a film deposition chamber; leading an ion beam of rare gas into the film deposition chamber, to cause collision of the ion beam with the target, sputtering-emission of constitutive atoms of the target, and supply of the emitted atoms to the substrate; and leading oxide gas including oxygen radicals as a main element thereof into the film deposition chamber.

The substrate indicates a glass substrate, a flexible substrate including an organic material such as polyimide, or the like. The substrate coated with a transparent conductive film indicates a coated substrate having a transparent conductive film deposited directly on a substrate, or a coated substrate having a transparent conductive film deposited on another film formed on a substrate. The substrate coated with a transparent conductive film further includes a coated substrate having two transparent conductive films deposited on both sides of a substrate, not only one transparent conductive film deposited on one side of the substrate. Moreover, the oxide gas indicates oxygen radicals, oxygen ions, oxygen gas, nitrogen dioxide gas or the like, or mixed gas including such matter.

The transparent conductive film on the substrate is deposited by leading an ion beam of rare gas into the film deposition chamber by ion beam sputtering. Since the substrate and film are not exposed to plasma in the deposition process, the invention can avoid a situation that high speed particles and negative ions in plasma collide with or enter the substrate and film, damaging the film. Moreover, since the oxide gas including oxygen radicals as a main element thereof which is supplied to the substrate has high reactivity, a transparent conductive film on a proper oxidation level can be deposited at a room temperature. Consequently, the deposited film has preferable physical properties of low resistivity and high transmission. Moreover, since the film is not damaged by plasma, the film can be deposited at a room temperature and deposition speed is preferably slow, the invention does not cause roughness on the surface of the transparent conductive film and preferable flatness of the surface can be achieved. Furthermore, it is possible to deposit a transparent conductive film on a substrate including an organic material which is damaged at a high temperature.

For the substrate coated with a transparent conductive film according to the present invention, the oxide gas may be generated through electron cyclotron resonance.

In this substrate coated with a transparent conductive film, the oxide gas of which includes still more oxygen radicals, proper oxidation level of the metal is achieved and physical properties of the transparent conductive film is enhanced.

In the substrate coated with a transparent conductive film according to the present invention, the transparent conductive film may be deposited on a film including an organic material, which film is deposited on the substrate.

In this substrate coated with a transparent conductive film, since a film can be deposited at a room temperature, the transparent conductive film can be deposited on a film including an organic material which is damaged at a high temperature.

In the substrate coated with a transparent conductive film according to the present invention, the substrate may be a glass substrate.

This substrate coated with a transparent conductive film having a preferable quality, in which the substrate is a glass substrate, can be used for a display apparatus such as an LCD and an EL apparatus, a photovoltaic apparatus such as a solar battery and an optical sensor, a semi-conductor apparatus such as a TFT, an optical communication apparatus such as a light modulator and an optical switch, or the like. For instance, when this substrate coated with a transparent conductive film is applied to an EL element, each layer formed on a transparent conductive film deposited on a substrate has a flat surface and light is emitted uniformly from a luminescent layer. Moreover, since an electric field is applied uniformly, dielectric breakdown seldom occurs.

In the substrate coated with a transparent conductive film according to the present invention, the transparent conductive film may be an indium oxide film with tin doped therein.

This substrate coated with a transparent conductive film, which has still higher transmission and lower resistivity, can be used for a flat-panel display such as a liquid crystal display element, a solar battery or the like.

Another substrate coated with a transparent conductive film according to the present invention comprises a substrate and a transparent conductive film including an oxide of metal or alloy, which film is deposited on the substrate, wherein the transparent conductive film is deposited by: disposing a substrate and a target including an oxide of metal or alloy in a film deposition chamber; leading an ion beam of rare gas into the film deposition chamber, to cause collision of the ion beam with the target, sputtering-emission of atoms or molecules constituting the target, and supply of the emitted atoms or molecules to the substrate; and leading oxide gas including oxygen gas or oxygen radicals as a main element thereof into the film deposition chamber.

Since the film on the substrate is deposited by leading an ion beam of rare gas into the film deposition chamber, the substrate and film are not exposed to plasma in the deposition process. Consequently, the film is not damaged, and a transparent conductive film on a proper oxidation level can be deposited at a room temperature. As a result, the deposited film has preferable physical properties of low resistivity and high transmission. Moreover, preferable flatness of the surface can be achieved. Furthermore, it is possible to deposit a transparent conductive film on a film or substrate including an organic material which is damaged at a high temperature.

For the substrate coated with a transparent conductive film according to the present invention, the oxide gas may be generated through electron cyclotron resonance.

In this substrate coated with a transparent conductive film, the oxide gas of which includes still more oxygen radicals, physical properties of the deposited transparent conductive film is further enhanced.

A method for manufacturing a substrate coated with a transparent conductive film according to the present invention is a method for depositing a transparent conductive film including an oxide of metal or alloy on a substrate by: disposing a substrate and a target including metal or alloy in a film deposition chamber; leading an ion beam of rare gas into the film deposition chamber, to cause collision of the ion beam with the target, sputtering-emission of constitutive atoms of the target, and supply of the emitted atoms to the substrate; and leading oxide gas including oxygen radicals as a main element thereof into the film deposition chamber.

Since it is possible to deposit a film in higher vacuum in the manufacturing method than in usual sputtering, the amount of gas entering the film can be reduced and high reactivity is obtained. Moreover, since an ion beam of rare gas is lead into the film deposition chamber and the substrate and film are not exposed to plasma in the deposition process, the invention can avoid a situation that high speed particles and negative ions in plasma collide with or enter the substrate and film, damaging the film. Furthermore, since the oxide gas including oxygen radicals as a main element thereof which is supplied to the substrate has high reactivity, a transparent conductive film on a proper oxidation level can be deposited at a room temperature, without raising the substrate temperature. Consequently, obtained is a substrate coated with a transparent conductive film with preferable physical properties of low resistivity and high transmission. Moreover, since the film is not damaged by plasma, the film can be deposited at a room temperature, deposition speed is preferably slow and the film is deposited in high vacuum, the invention does not cause roughness on the surface of the transparent conductive film and preferable flatness of the surface can be achieved.

As described above, by the manufacturing method of the invention capable of depositing a transparent conductive film with preferable physical properties at a room temperature, it is possible to deposit a transparent conductive film on a film or substrate including an organic material.

In the method for manufacturing a substrate coated with a transparent conductive film according to the present invention, the oxide gas may be generated through electron cyclotron resonance using microwaves.

In this manufacturing method, since the oxide gas includes still more oxygen radicals, proper oxidation level of the metal is achieved and physical properties of the transparent conductive film is further enhanced.

In the method for manufacturing a substrate coated with a transparent conductive film according to the present invention, microwave power for generating the electron cyclotron resonance may be limited to 200 W or higher.

In this manufacturing method, obtained transparent conductive film has still higher transmission, lower resistivity and preferable flatness. Though existence of many oxygen vacancies in the transparent conductive film causes decrease of transmission and increase of resistivity, high microwave power seems to realize high transmission and low resistivity of the transparent conductive film, since high microwave power leads to high radical concentration in oxide gas and proper oxidation level of metal.

In the method for manufacturing a substrate coated with a transparent conductive film according to the present invention, microwave power for generating the electron cyclotron resonance may be limited to 300 W or higher.

In this manufacturing method, the obtained transparent conductive film has still higher transmission, lower resistivity and preferable flatness.

A method for manufacturing a substrate coated with a transparent conductive film according to the present invention is a method for depositing a transparent conductive film including an oxide of metal or alloy on a substrate by: disposing a substrate and a target including an oxide of metal or alloy in a film deposition chamber; leading an ion beam of rare gas into the film deposition chamber, to cause collision of the ion beam with the target, sputtering-emission of atoms or molecules constituting the target, and supply of the emitted atoms or molecules to the substrate; and leading oxide gas including oxygen gas or oxygen radicals as a main element thereof into the film deposition chamber.

Since it is possible to deposit a film in higher vacuum in the manufacturing method than in usual sputtering, the amount of gas entering the film can be reduced and high reactivity can be obtained. Moreover, since an ion beam of rare gas is lead into the film deposition chamber and the substrate and film are not exposed to plasma in the deposition process, the film is not damaged, and a transparent conductive film on a proper oxidation level can be deposited at a room temperature, without raising the substrate temperature. Consequently, obtained is a substrate coated with a transparent conductive film with preferable physical properties of low resistivity and high transmission. Moreover, since the film is not damaged by plasma, the film can be deposited at a room temperature, deposition speed is preferably slow and the film is deposited in high vacuum, the invention does not cause roughness on the surface of the transparent conductive film and preferable flatness of the surface can be achieved.

Consequently, a transparent conductive film with preferable physical properties can be deposited at a room temperature, and hence, it is possible to deposit a transparent conductive film on a film or substrate including an organic material.

In the method for manufacturing a substrate coated with a transparent conductive film according to the present invention, the oxide gas may be generated through electron cyclotron resonance using microwaves.

In this manufacturing method, since the oxide gas includes still more oxygen radicals, physical properties of the deposited transparent conductive film is further enhanced.

The above and further objects and features of the invention will more fully be apparent from the following detailed description with accompanying drawings.

DETAILED DESCRIPTION OF THE INVENTION

The following description will explain the present invention in detail with reference to the drawings illustrating some embodiments thereof.

First Embodiment

Figure 1:
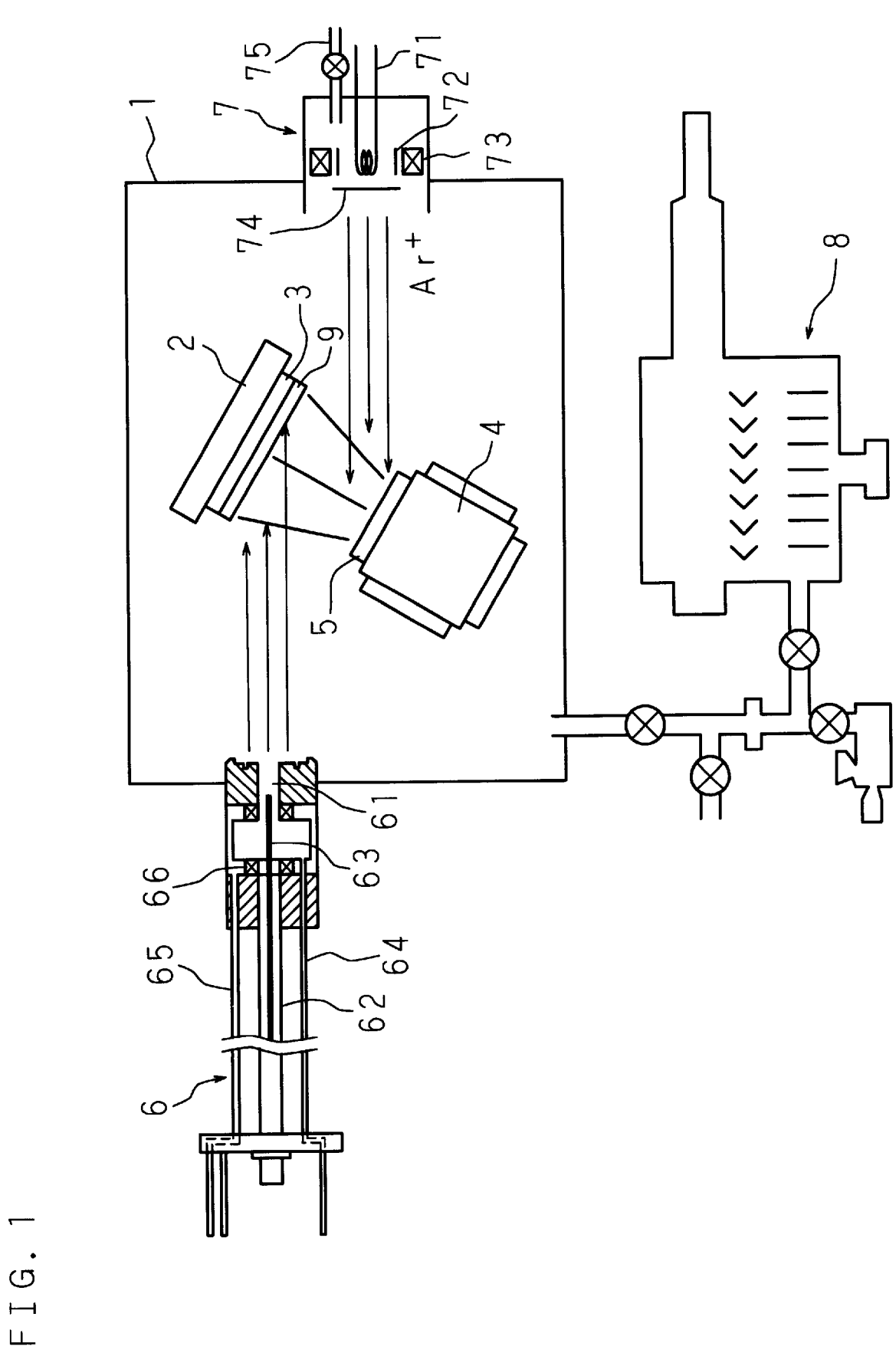
FIG. 1 is a sectional view showing a transparent conductive film depositing apparatus according to First Embodiment of the present invention.

FIG. 1 is a sectional view showing a transparent conductive film depositing apparatus according to First Embodiment of the present invention, and a reference numeral 1 indicates a film deposition chamber.

Disposed in the film deposition chamber 1 are a substrate 3 made of glass which is retained by a substrate holder 2, and a target 5 made of alloy of indium (In) and tin (Sn) which is retained opposite to the substrate 3 by a target holder 4. The mol % ratio of In to Sn in the target 5 is 95.4:4.6.

Into the film deposition chamber 1, oxide gas mainly including oxygen radicals and an Ar ion beam are respectively supplied from an ECR radical source 6 and an ion gun 7 of Kaufman-type.

The ECR radical source 6 comprises a discharge chamber 61, an antenna 63 extending through a microwave waveguide 62 for guiding a microwave to the discharge chamber 61 and a permanent magnet 66 for forming a magnetic field, which is provided on an outer wall of the discharge chamber 61. The discharge chamber 61 is cooled by water running through a water supply line 65, while oxygen gas is supplied through a gas supply line 64. When oxygen gas is lead into the discharge chamber 61 and is then excited by a microwave with a magnetic field applied thereto, plasma is generated by electron cyclotron resonance. The plasma includes many oxygen radicals, and the radicals are mainly extracted by a differential pressure between the inside and the outside.

The ion gun 7 comprises a filament 71, an anode 72, a magnet coil 73, an extraction electrode 74 and a gas leading line 75. The ion gun 7 forms high-density plasma with discharge, and an ion beam is extracted by the extraction electrode 74. In this embodiment, an ion beam of Ar gas is lead into the film deposition chamber 1.

The inside of the film deposition chamber 1 is made into vacuum by a cryopump 8.

The following description will explain a process to deposit an ITO film 9 on a substrate 3 using a transparent conductive film depositing apparatus constructed as above. First, the inside of the film deposition chamber 1 is made into vacuum of 0.017 Pa by the cryopump 8. An ion beam of Ar gas is then lead from the ion gun 7 into the film deposition chamber 1, to cause collision of the ion beam with the target 5, sputtering-emission of constitutive atoms of the target, and supply of the emitted atoms to the substrate 3. Oxygen radicals are then lead from the ECR radical source 6 into the film deposition chamber 1 and supplied to the substrate 3, and thereby an ITO film 9 is deposited on the substrate 3 at a room temperature, without heating the substrate 3.

Shown in the following are results of investigation on the relation between a deposition speed, a transmission, a resistivity or a surface roughness Ra and an ECR microwave power, obtained when a film is deposited with ECR microwave power of the ECR radical source 6 changed under other deposition conditions fixed.

The deposition conditions are shown on Table 1.

TABLE 1

| TARGET | In—Sn (95.4:4.6 mol %) |
|---|---|
| SUBSTRATE TEMPERATURE | ROOM TEMPERATURE |
| Ar FLOW RATE | 4.0 CCM |
| $O_2$ FLOW RATE | 8.0 CCM |
| ION GUN | 800 eV, 60 mA |
| ECR RADICAL SOURCE | 0–450 W |
| PRESSURE DURING DEPOSITION | 0.017 Pa |
| BACK PRESSURE | $9.1 \times 10^{-5}$ Pa |
| FILM THICKNESS | 70 nm |
| DEPOSITION SPEED | 6 nm/min |

Figure 2:
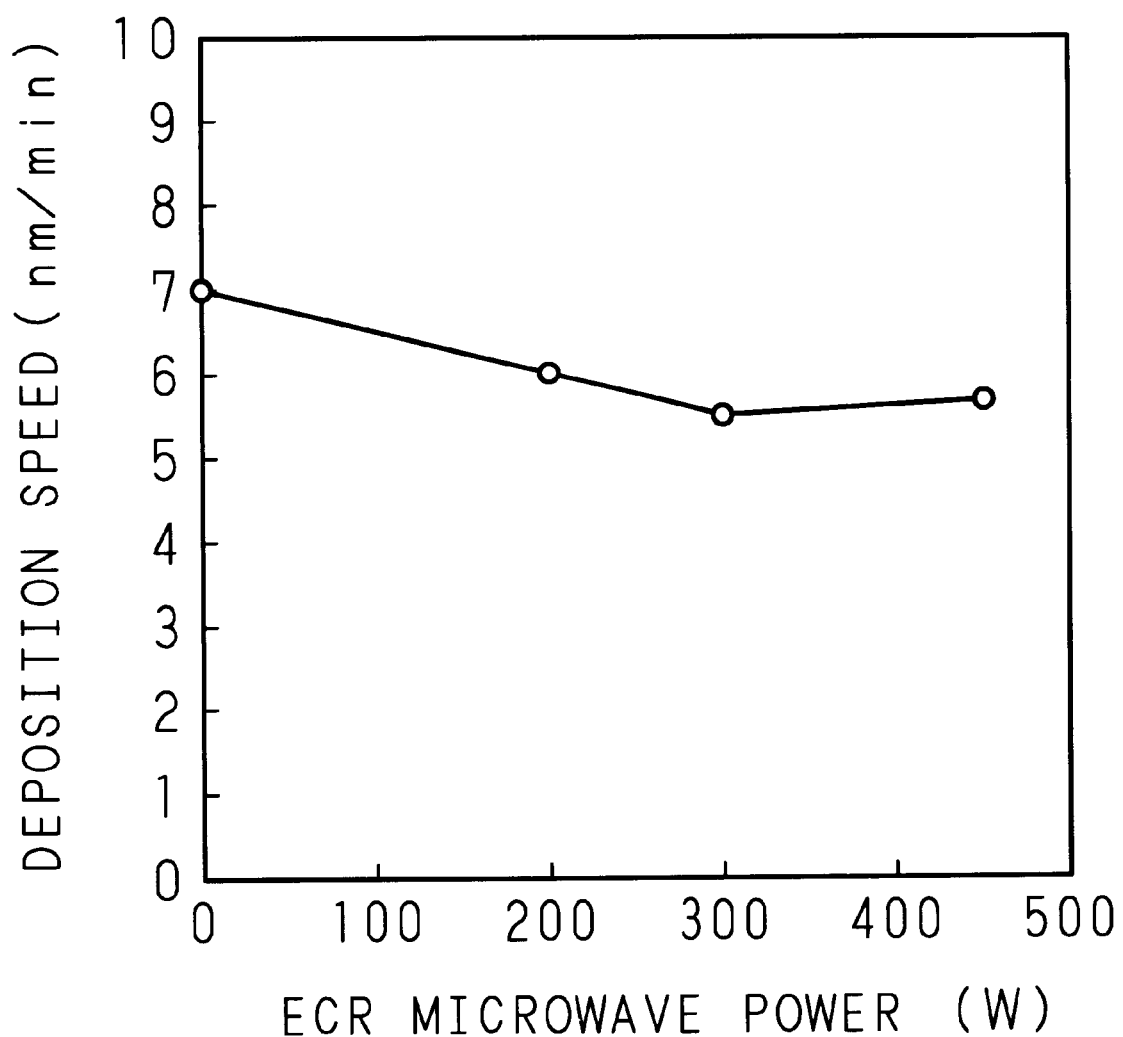
FIG. 2 is a graph showing the relation between a deposition speed and an ECR (Electron Cyclotron Resonance) microwave power.

FIG. 2 is a graph showing the relation between a deposition speed and an ECR microwave power, obtained when a film is deposited with ECR microwave power of the ECR radical source 6 changed under deposition conditions shown on Table 1.

FIG. 2 shows that, though the deposition speed decreases as the ECR microwave power increases, the decrease level is small enough to ensure mass production.

Figure 3:
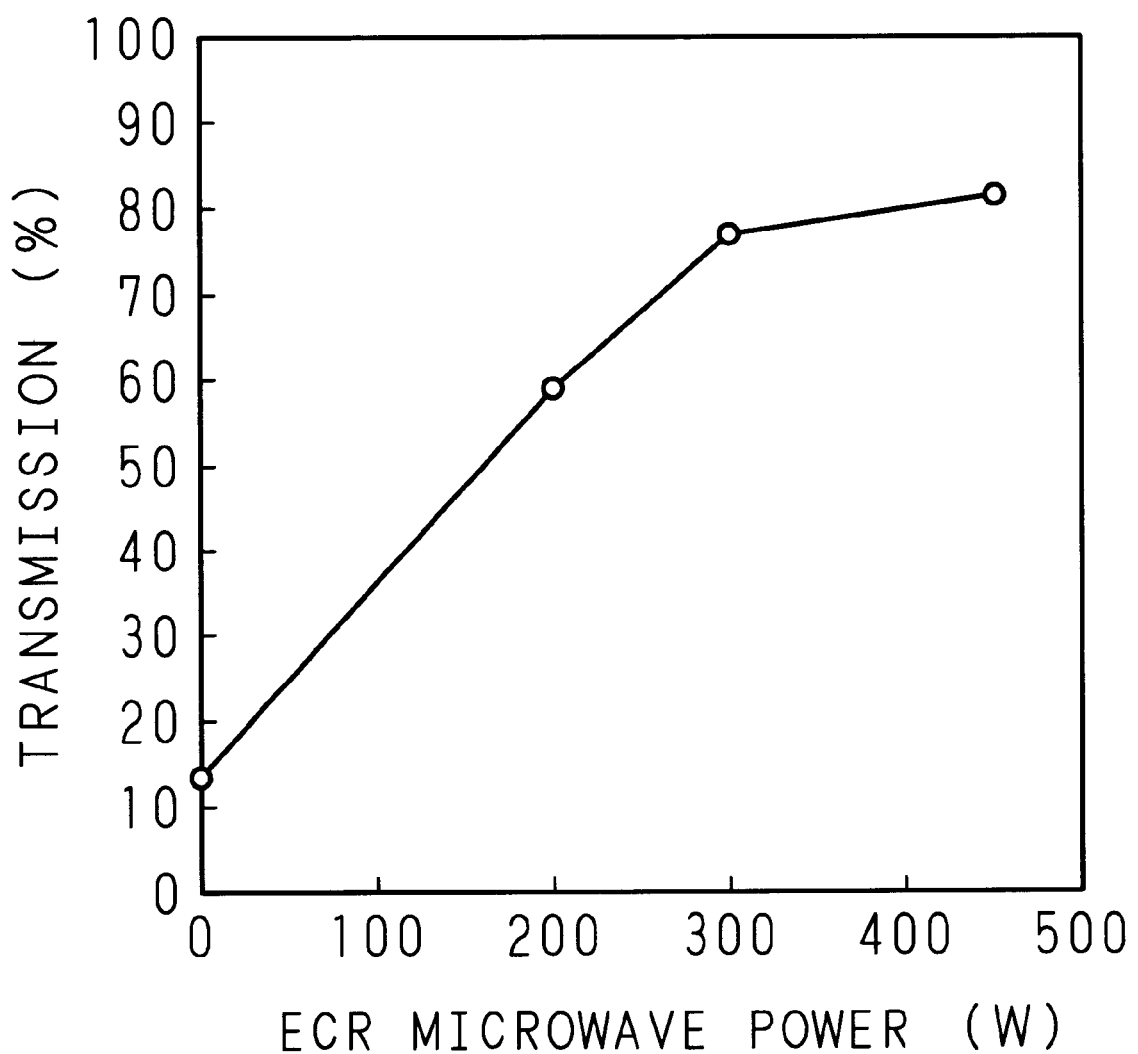
FIG. 3 is a graph showing the relation between a transmission on a wavelength of 550 nm and an ECR microwave power.

FIG. 3 is a graph showing the relation between a transmission on a wavelength of 550 nm and an ECR microwave power, obtained when a film is deposited with ECR microwave power of the ECR radical source 6 changed under deposition conditions shown on Table 1. The transmission was measured with a spectrophotometer.

FIG. 3 shows that the transmission increases as the ECR microwave power increases. This seems to be due to the following reason. When the ITO film 9 has many oxygen vacancies, the transmission decreases. However, when the ECR microwave power increases, the amount of oxygen radicals generated at the ECR radical source 6 increases and thereby the oxidation level of In and Sn becomes a proper level. Consequently, a high transmission is obtained.

Figure 4:
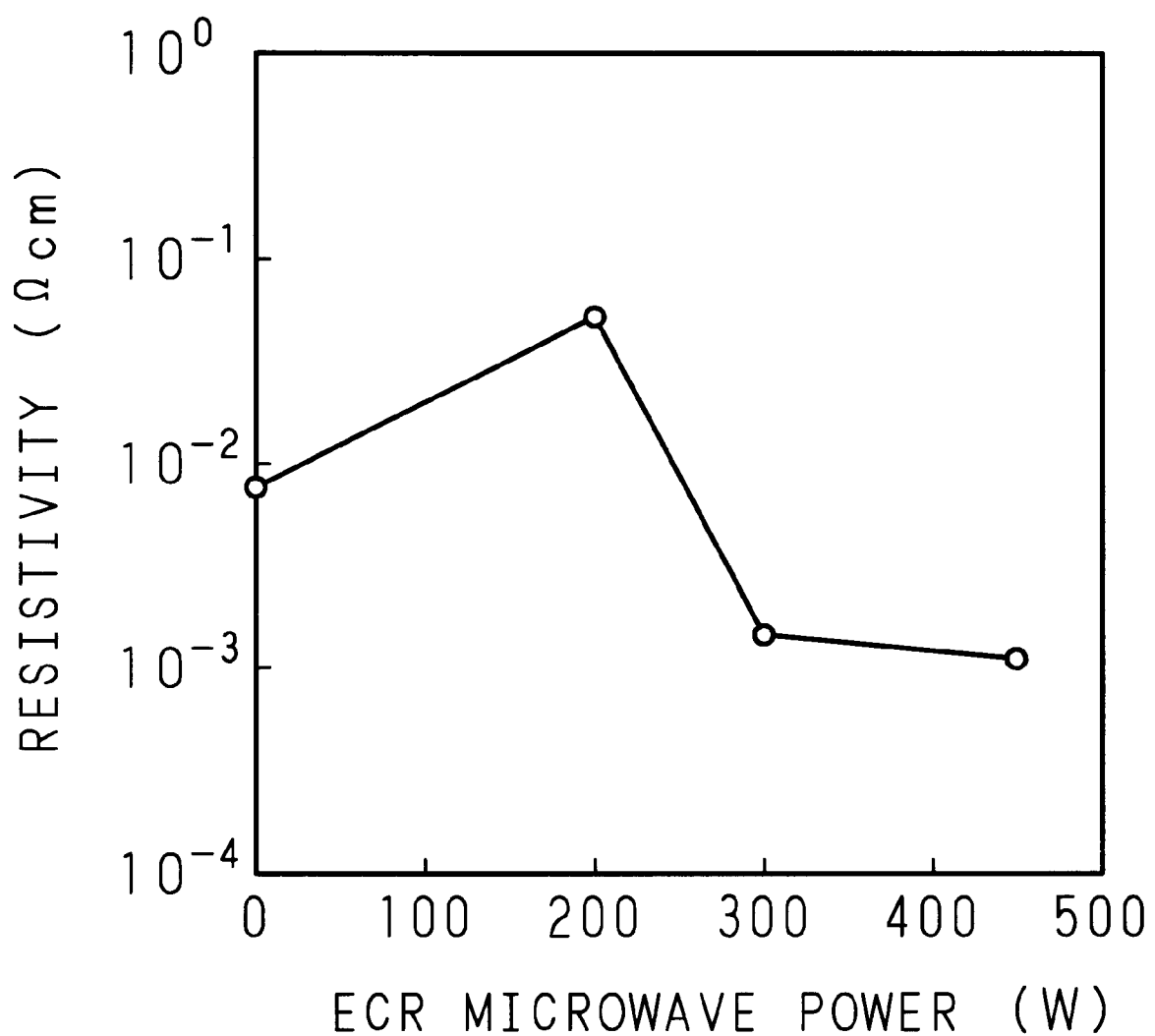
FIG. 4 is a graph showing the relation between a resistivity and an ECR microwave power.

FIG. 4 is a graph showing the relation between a resistivity and an ECR microwave power, obtained when a film is deposited with ECR microwave power of the ECR radical source 6 changed under deposition conditions shown on Table 1. The resistivity was measured by a four-point probe method.

FIG. 4 shows that the resistivity reaches a maximum value when the ECR microwave power is 200 W, and begins to decrease when the ECR microwave power exceeds 200 W. This seems to be due to the following reason. When the ECR microwave power is 0 W, only oxygen gas is supplied to the substrate 3 as oxide gas, and the generated film includes In and Sn which are not sufficiently oxygenated. The generated film slightly has metal properties and has small resistivity. As the ECR microwave power increases and oxygen radicals are generated, oxidation of In and Sn progresses and the resistivity increases at a certain level. When the ECR microwave power exceeds 200 W, the amount of the generated oxygen radicals increases and the oxidation of In and Sn further progresses, and the composition of the generated film comes near to the composition of $In_2O_3$. After a proper oxidation level of the generated film is achieved, the resistivity decreases.

Figure 5:
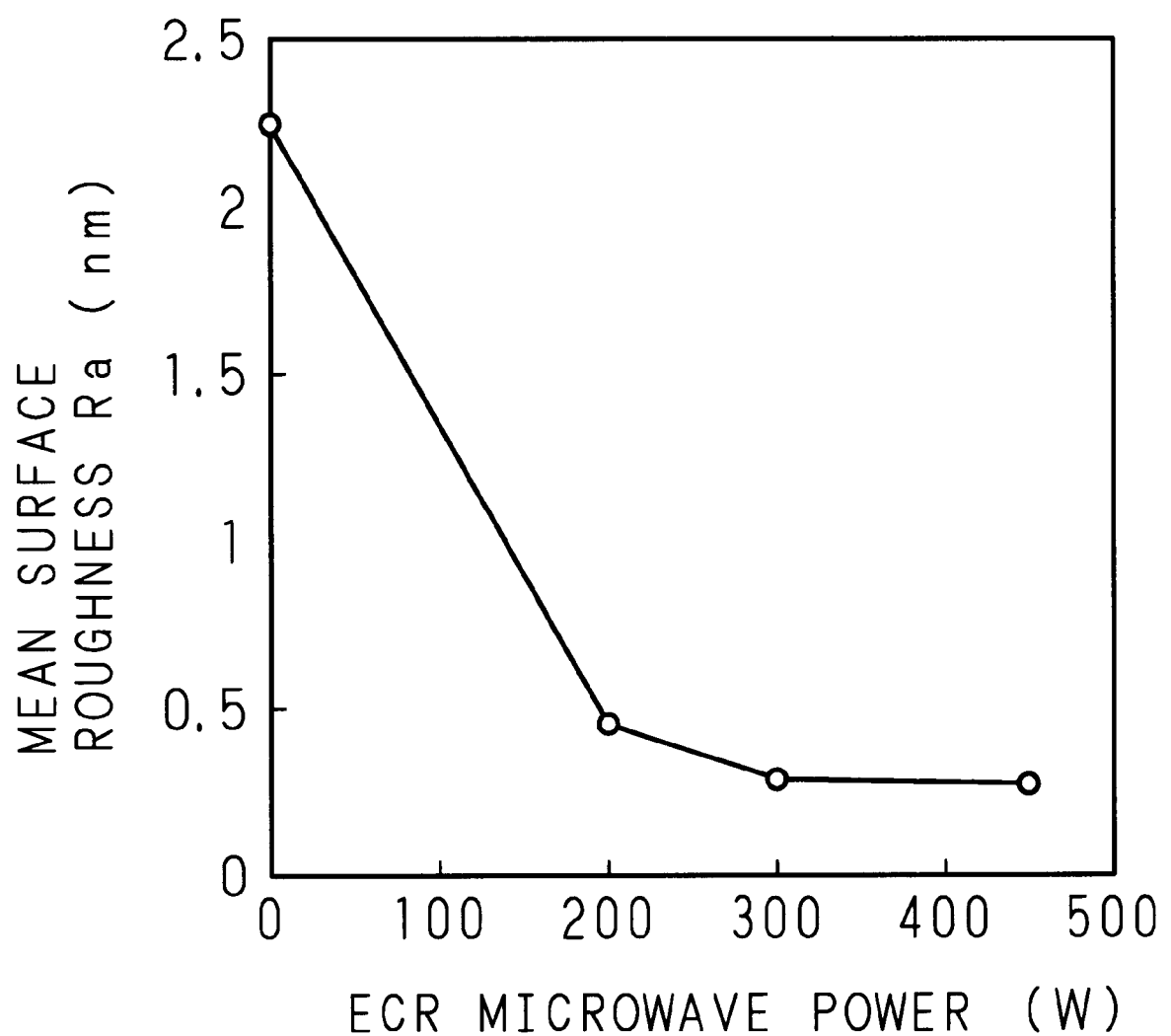
FIG. 5 is a graph showing the relation between a mean surface roughness Ra and an ECR microwave power.

FIG. 5 is a graph showing the relation between a mean surface roughness Ra and an ECR microwave power, obtained when a film is deposited with ECR microwave power of the ECR radical source 6 changed under deposition conditions shown on Table 1. The mean surface roughness Ra was measured with an AFM (Atomic Force Microscope).

FIG. 5 shows that Ra=0.26 nm when the ECR microwave power is 450 W. This value is smaller than one tenth of a value of a substrate coated with a transparent conductive film which is mass-produced in DC magnetron sputtering or RF magnetron sputtering. This seems to be due to the reason that, in the deposition method according to the present invention, occurrence of roughness on the surface of a transparent conductive film is depressed since the film is not damaged by plasma, the film is deposited at a room temperature, the deposition speed is preferably slow and the film is deposited in high vacuum.

Shown on Table 2 are results of measurement of physical properties of ITO films included in ITO-coated substrates A and B which are manufactured in a conventional DC magnetron sputtering (the substrate temperature: 300° C.) by another company.

TABLE 2

| SUBSTRATE | TRANSMISSION (%) | RESISTIVITY ($\Omega$cm) | Ra (nm) | FILM THICKNESS (nm) |
|---|---|---|---|---|
| A |  | $2.55 \times 10^{-4}$ | 5 | 85 |
| B | 81.5 | $2.93 \times 10^{-4}$ | 35 | 160 |

FIGS. 2 through 5 and Table 2 show that an ITO film 9 on a substrate manufactured by the method of the present invention has resistivity and transmission at approximately the same level with conventional films, and has more preferable flatness than conventional films. In particular, preferable physical properties are obtained when the ECR microwave power is 200 W or higher, or more preferably, 300 W or higher.

Figure 6:
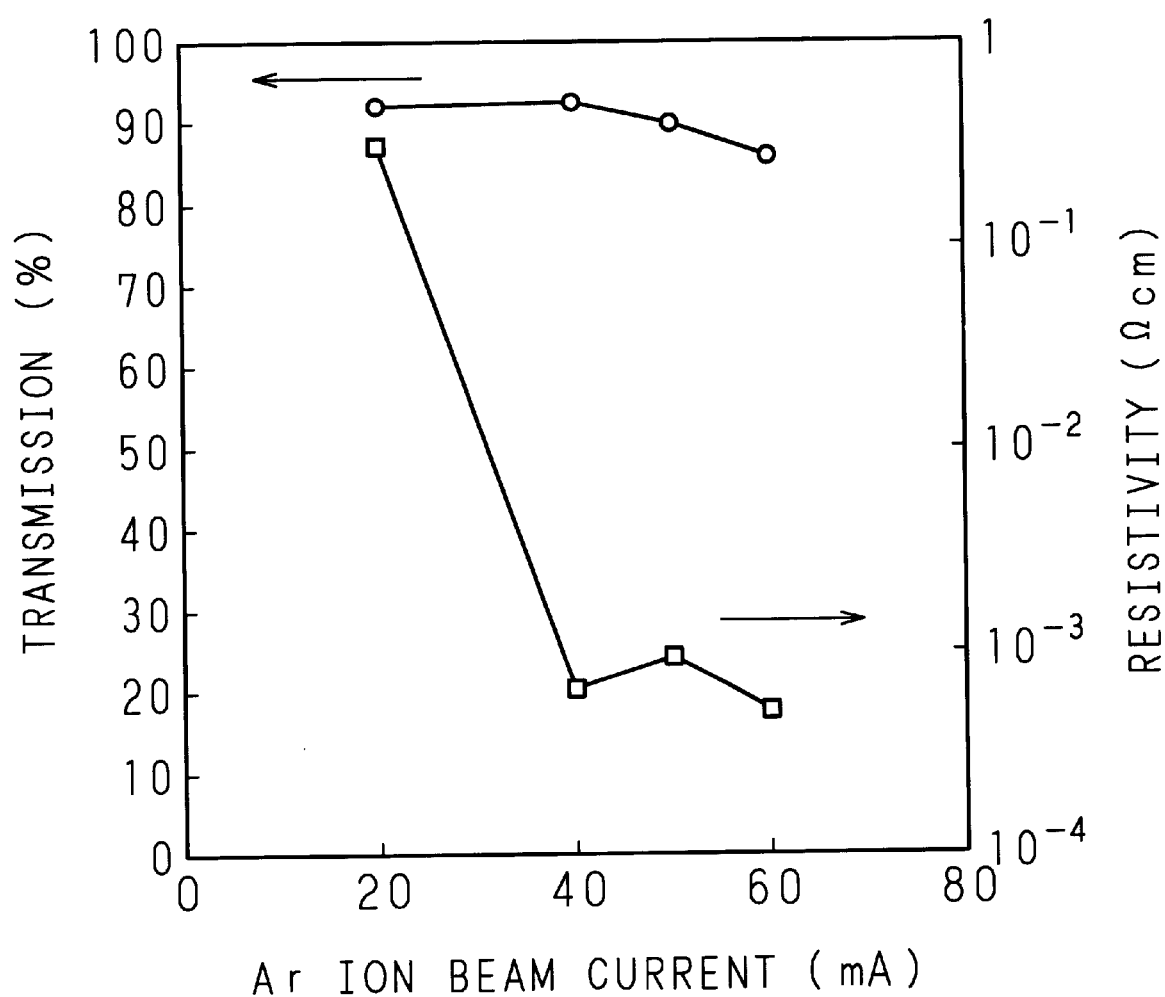
FIG. 6 is a graph showing the relation between a transmission or a resistivity and an Ar ion beam current.
Figure 7:
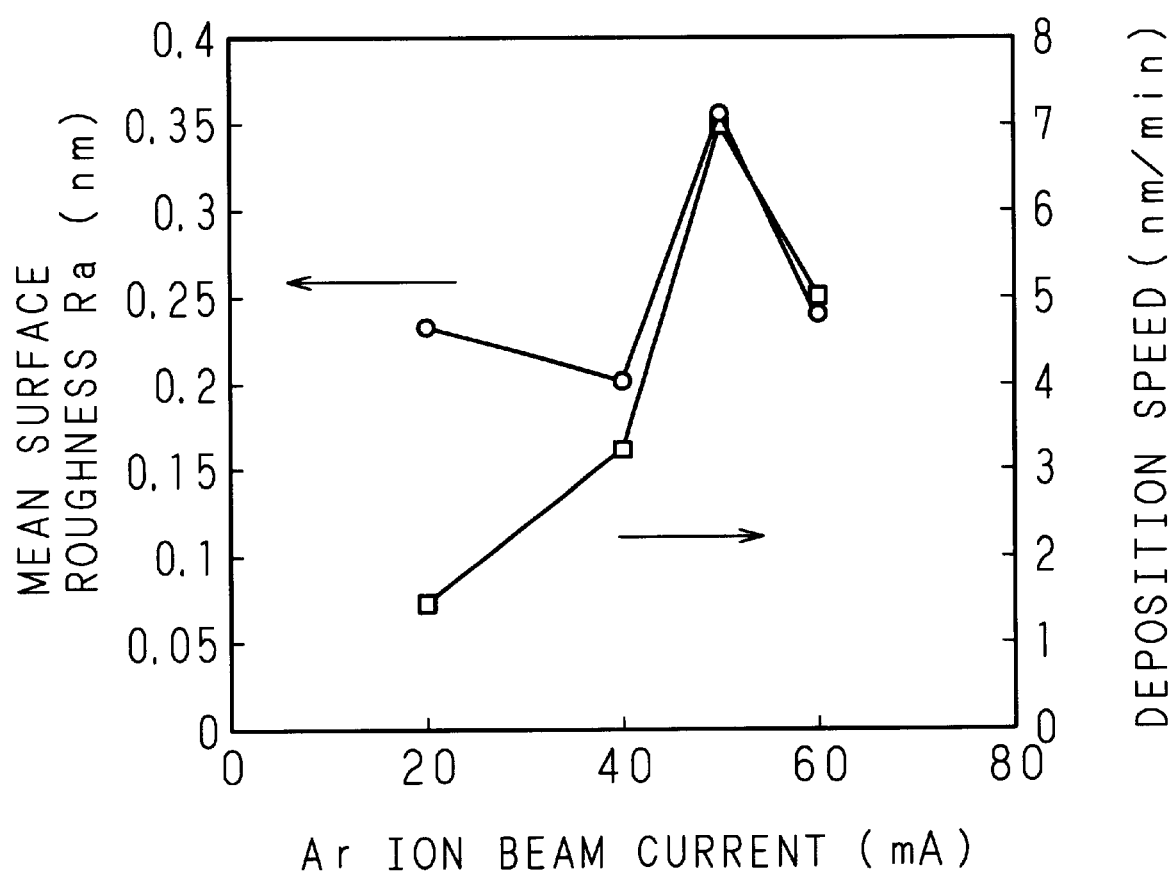
FIG. 7 is a graph showing the relation between a mean surface roughness Ra or a deposition speed and an Ar ion beam current.

FIGS. 6 and 7 are graphs showing the relation between physical properties and an Ar ion beam current, obtained when a film is deposited on a non-heated substrate with the Ar ion beam current of the ion gun 7 changed and with the Ar ion beam energy of 650 eV of the ion gun 7 and the ECR microwave power of 450 W of the ECR radical source 6, using the target 5 including In and Sn in a mol % ratio of 95.4:4.6. FIG. 6 shows a transmission and a resistivity. FIG. 7 shows a mean surface roughness Ra and a deposition speed.

FIG. 6 shows that the transmission scarcely changes and a preferable resistivity is obtained when the Ar ion beam current is 40 mA or larger. FIG. 7 shows that a preferable mean surface roughness Ra is obtained, and a preferable deposition speed is obtained when the Ar ion beam current is 50 mA or larger.

Figure 8:
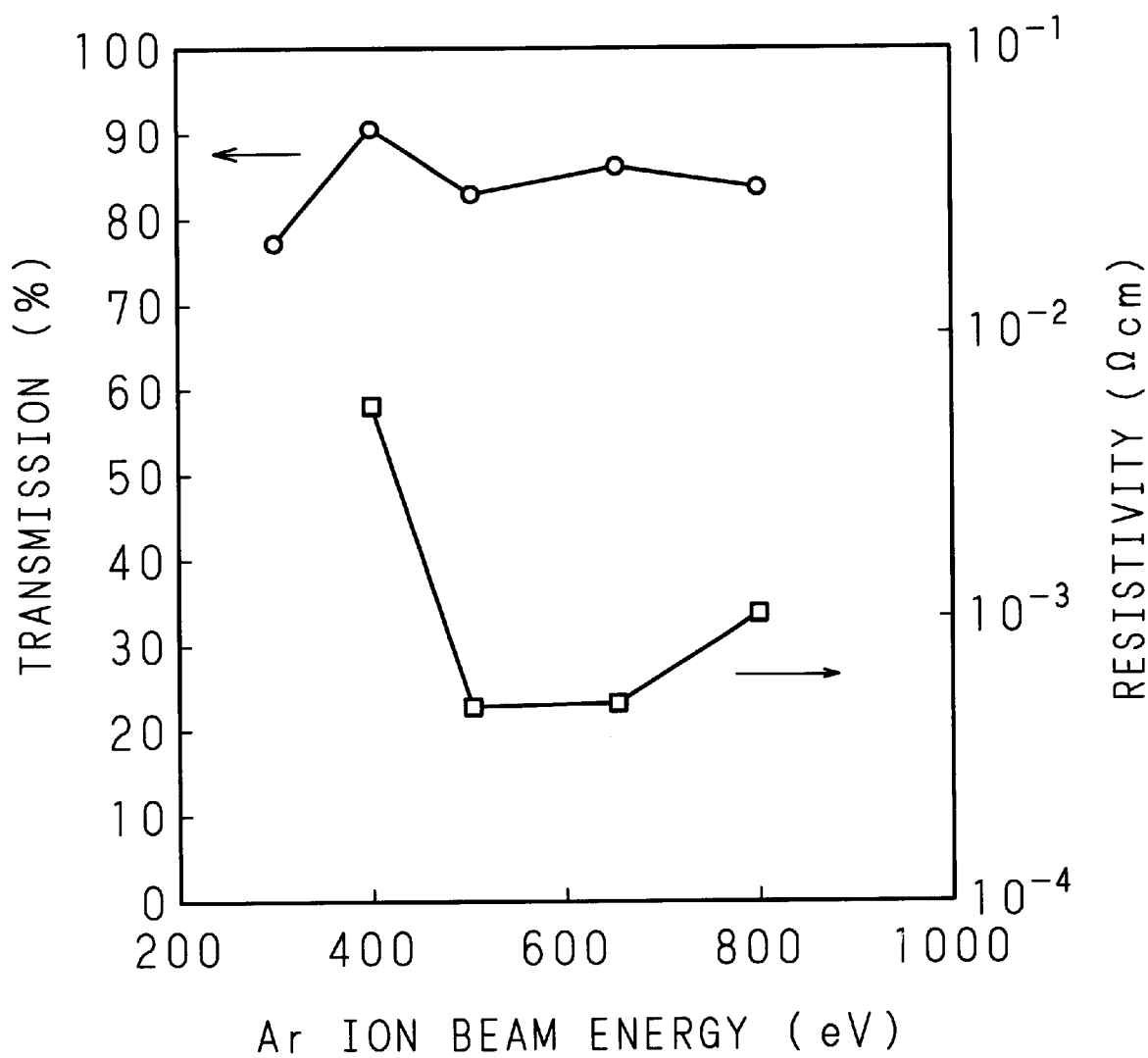
FIG. 8 is a graph showing the relation between a transmission or a resistivity and an Ar ion beam energy.
Figure 9:
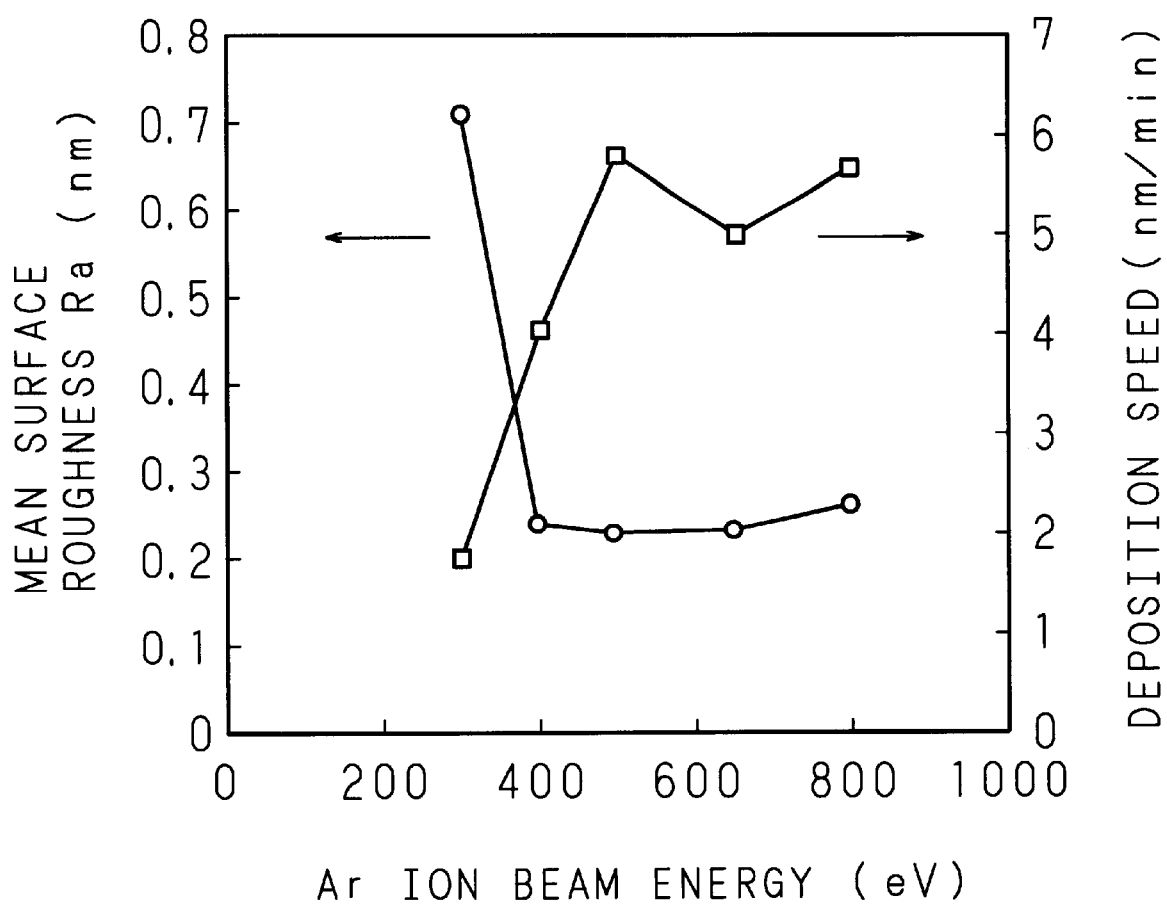
FIG. 9 is a graph showing the relation between a mean surface roughness Ra or a deposition speed and an Ar ion beam energy.

FIGS. 8 and 9 are graphs showing the relation between physical properties and an Ar ion beam energy, obtained when a film is deposited on a non-heated substrate with the Ar ion beam energy of the ion gun 7 changed and with the Ar ion beam current of 60 mA of the ion gun 7 and the ECR microwave power of 450 W of the ECR radical source 6, using the target 5 including In and Sn in a mol % ratio of 95.4:4.6. The axis of ordinate in FIG. 8 shows a transmission or a resistivity. The axis of ordinate in FIG. 9 shows a mean surface roughness Ra or a deposition speed.

FIG. 8 shows that the transmission is 80% or larger when the Ar ion beam energy is 300 eV or larger, and the resistivity is small when the Ar ion beam energy is between 500 and 650 eV. FIG. 9 shows that a preferable mean surface roughness Ra is obtained, and a preferable deposition speed is obtained when the Ar ion beam energy is 500 eV or larger.

As described above, the ITO film 9 on the substrate 3 obtained by the manufacturing method of this embodiment has preferable properties. Moreover, with this manufacturing method in which the ITO film 9 can be deposited at a room temperature without heating the substrate 3, the ITO film 9 can be deposited on a film including an organic material such as a polymer film or on the substrate 3 including an organic material such as polyimide, without damaging the organic material. The substrate 3 having this ITO film 9 deposited thereon can be widely used for a display apparatus such as an LCD and an EL apparatus, a photovoltaic apparatus such as a solar battery and an optical sensor, a semi-conductor apparatus such as a TFT, an optical communication apparatus such as a light modulator and an optical switch, or the like.

The following description will explain a case where the substrate 3 having the ITO film 9 according to this embodiment deposited thereon is applied to an EL element.

Figure 10:
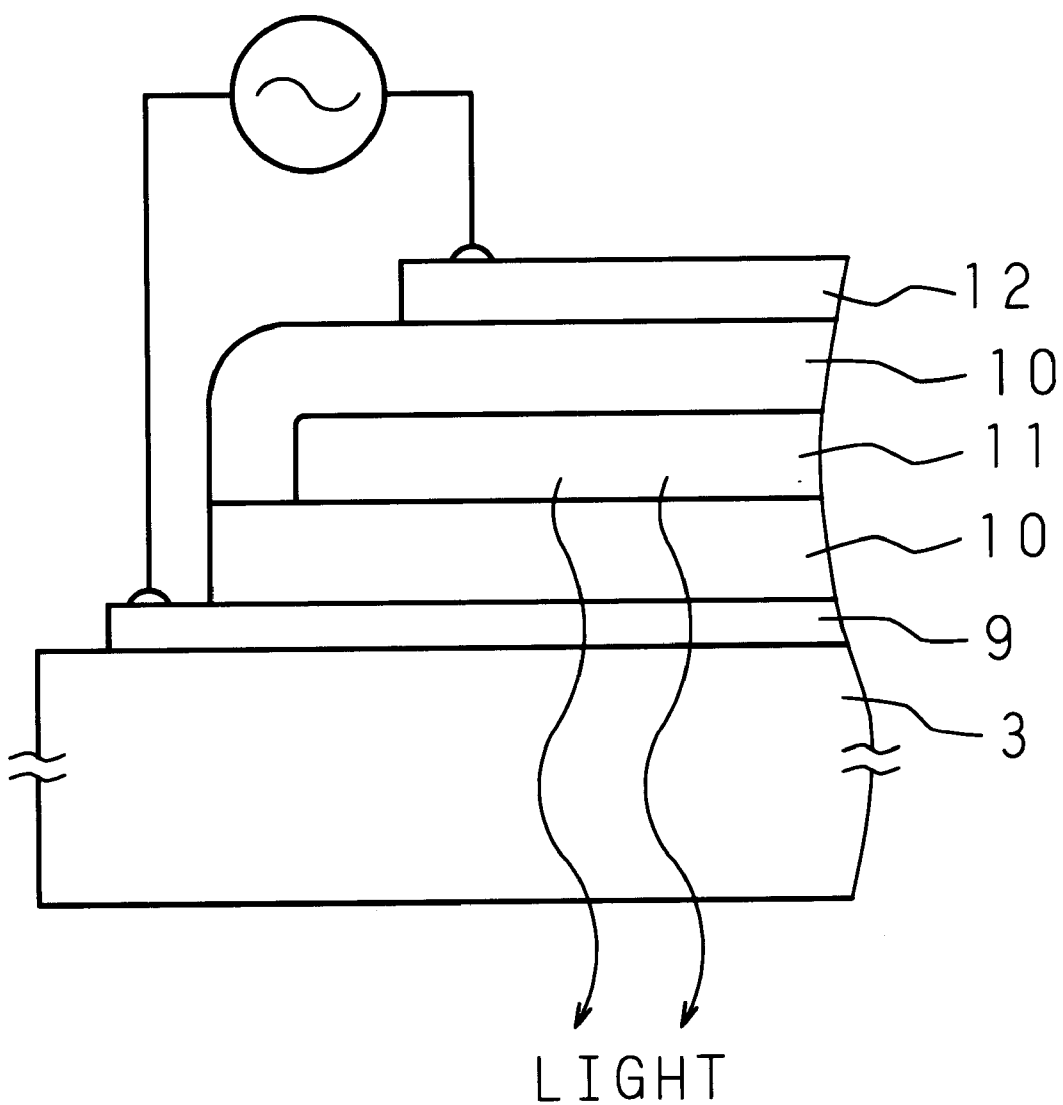
FIG. 10 is a sectional view showing an EL element including an ITO film according to First Embodiment.

FIG. 10 is a sectional view showing an EL element including the ITO film 9 according to this embodiment.

For the EL element, the ITO film 9 as a transparent electrode, an insulating layer 10 made of $Y_2O_3$, a luminescent layer 11 made of ZnS with Mn doped therein, another insulating layer 10 and an Al electrode 12 are deposited on the substrate 3 in this order.

In this EL element, the surface of the ITO film 9 is flat, and the surface of each layer formed thereon is also flat. Consequently, when applying alternating voltage of some kHz between 100 and 200 V across the upper and lower electrodes, electrons at the interface of the insulating layer 10 and luminescent layer 11 are uniformly excited to the conduction band of the luminescent layer 11, accelerated electrons excite the luminescence center, and light is uniformly emitted. Moreover, since an electric field is uniformly applied, dielectric breakdown seldom occurs.

Second Embodiment

Figure 11:
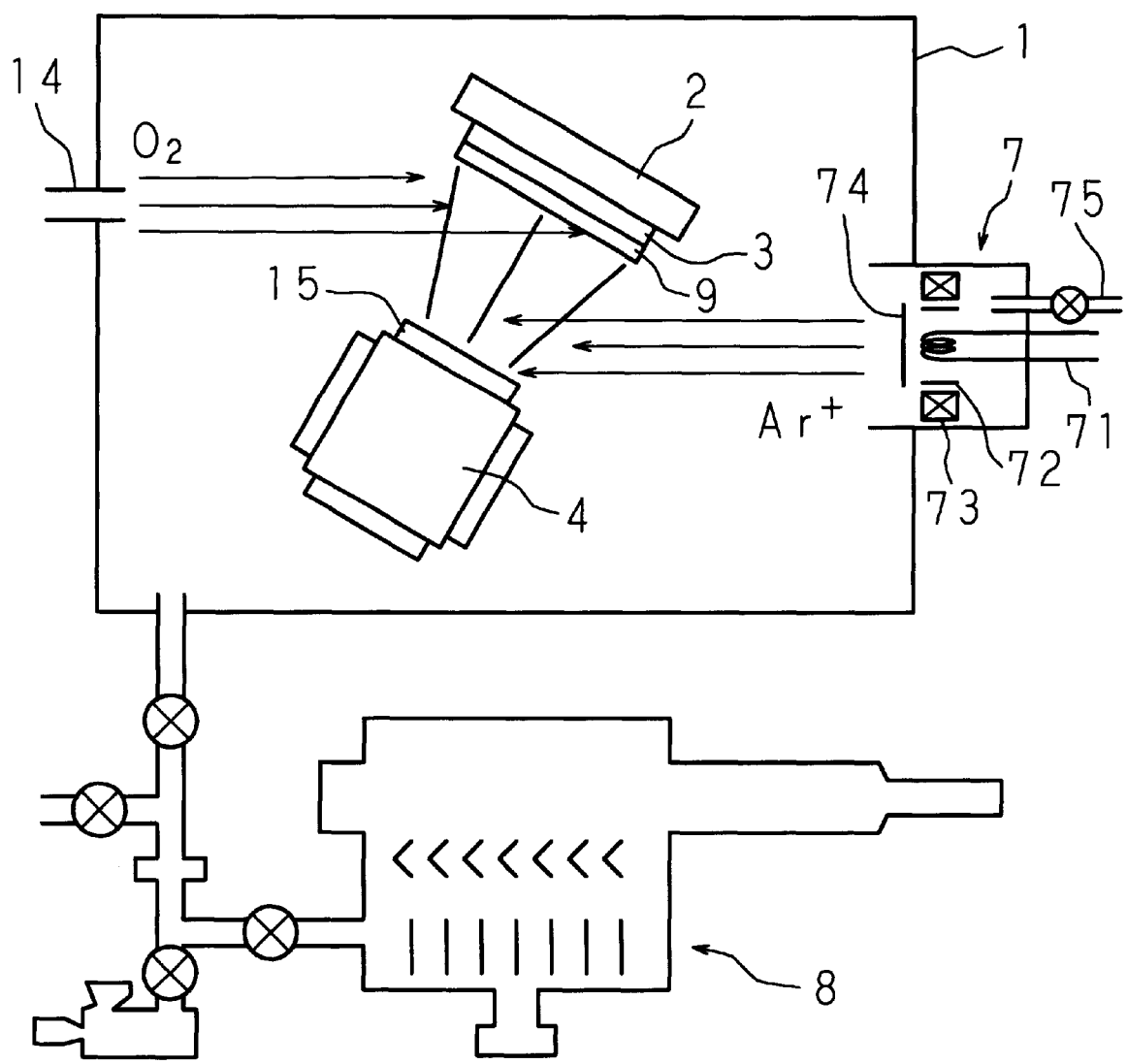
FIG. 11 is a sectional view showing a transparent conductive film depositing apparatus according to Second Embodiment of the present invention.

FIG. 11 is a sectional view showing a transparent conductive film depositing apparatus according to Second Embodiment of the present invention. In FIG. 11, like codes are used to refer to like parts shown in FIG. 1.

In this transparent conductive film depositing apparatus according to Second Embodiment, in stead of the oxygen radicals supplied from the ECR radical source 6, oxygen gas is supplied through an oxygen gas supply line 14. Moreover, a target 15 is not made of alloy of In and Sn, but made of an oxide of In and Sn.

The following description will explain a process to deposit an ITO film 9 on the substrate 3 using a transparent conductive film depositing apparatus constructed as above. First, the inside of the film deposition chamber 1 is made into vacuum of 0.017 Pa by the cryopump 8. An ion beam of Ar gas is then lead from the ion gun 7 into the film deposition chamber 1, to cause collision of the ion beam with the target 15, sputtering-emission of atoms or molecules constituting the target, and supply of the emitted atoms or molecules to the substrate 3. Oxygen gas is also lead into the film deposition chamber 1 through the oxygen gas supply line 14, and thereby an ITO film 9 is deposited on the substrate 3.

Figure 12:
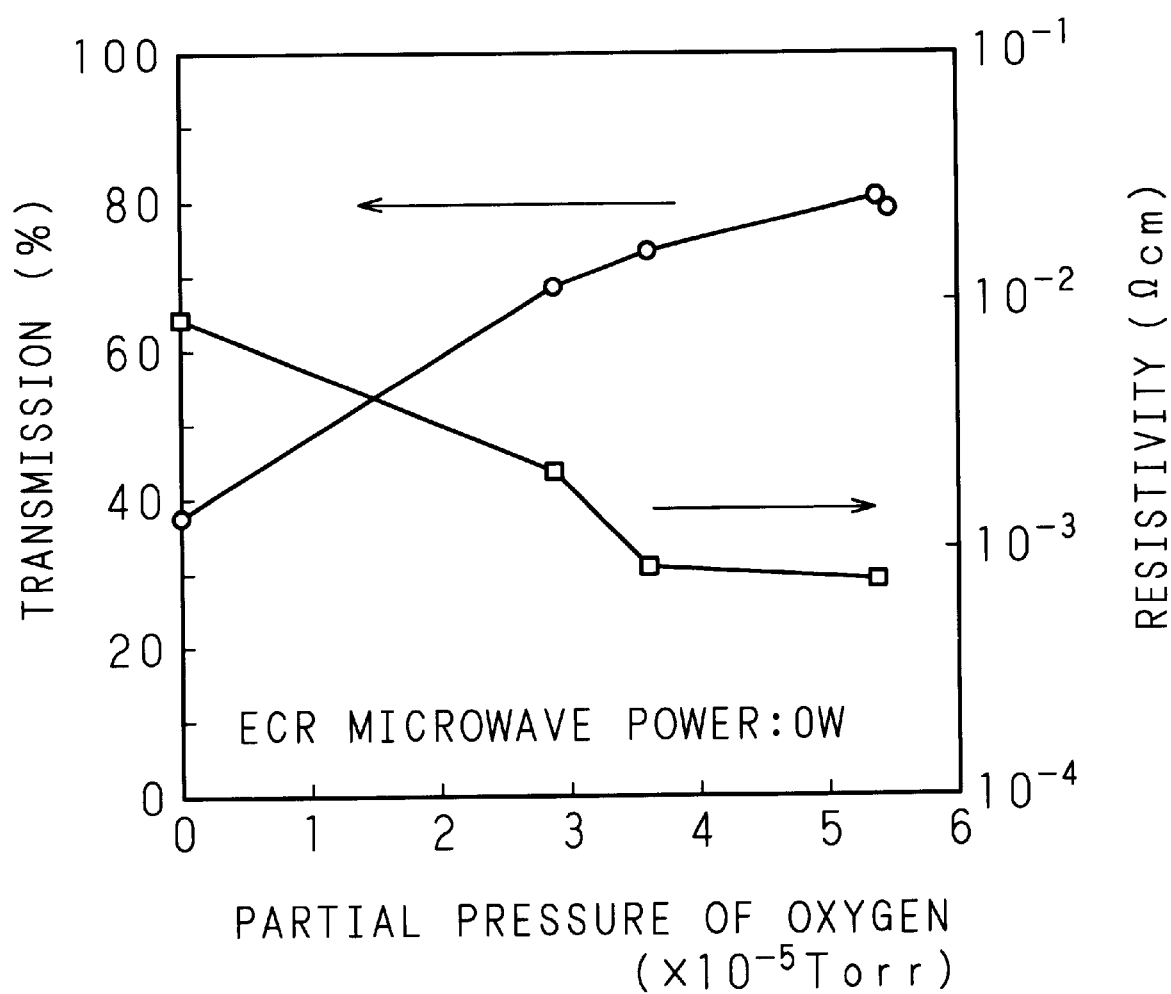
FIG. 12 is a graph showing the relation between a transmission or a resistivity and a partial pressure of oxygen.
Figure 13:
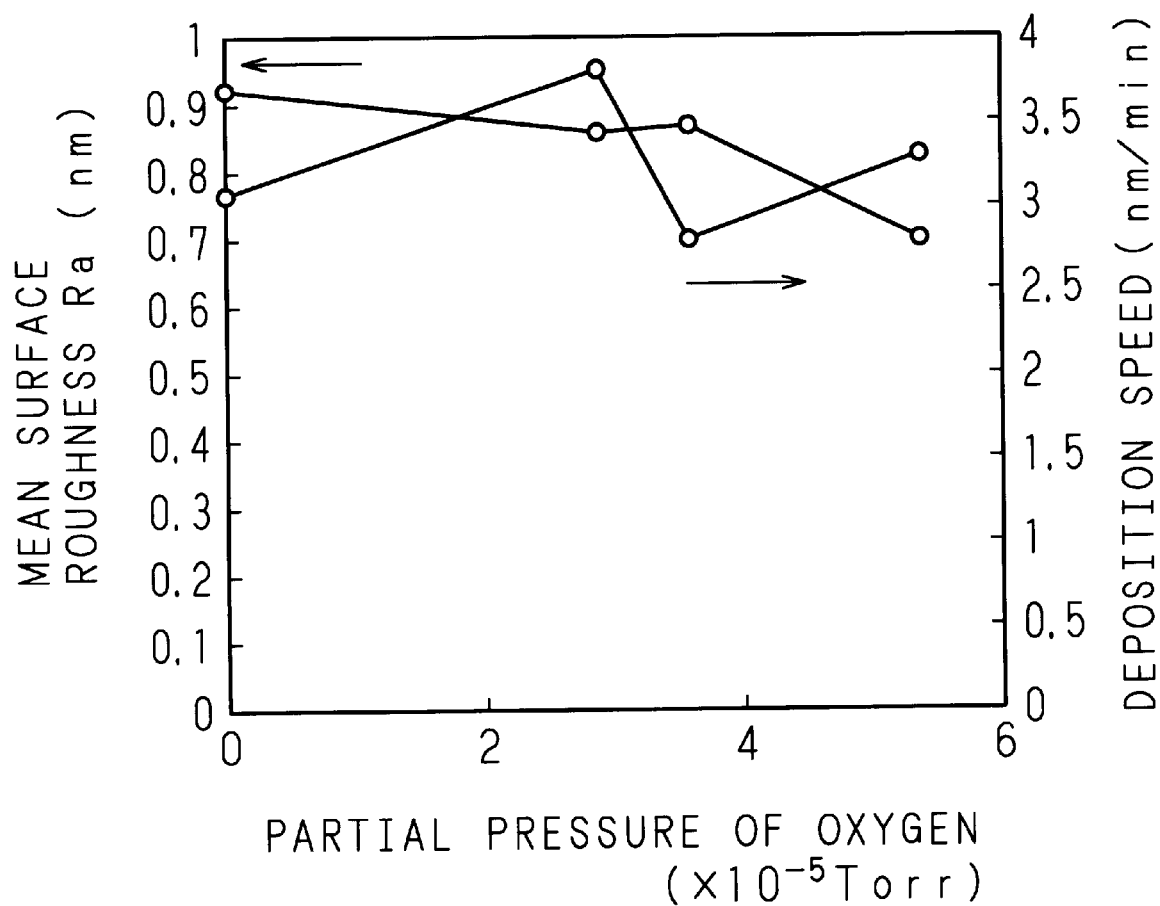
FIG. 13 is a graph showing the relation between a mean surface roughness Ra or a deposition speed and a partial pressure of oxygen.

FIGS. 12 and 13 are graphs showing the relation between physical properties and an partial pressure of oxygen, obtained when a film is deposited on a non-heated substrate with the partial pressure of oxygen changed and with the Ar ion beam energy of 800 eV and the Ar ion beam current of 60 mA of the ion gun 7, using the target 15 made of an oxide including InO and $SnO_2$ in a mol % ratio of 95.4:4.6. The axis of ordinate in FIG. 12 shows a transmission or a resistivity. The axis of ordinate in FIG. 13 shows a mean surface roughness Ra or a deposition speed.

FIG. 12 shows that, as the partial pressure of oxygen increases, the transmission increases and the resistivity decreases. FIG. 13 shows that the mean surface roughness Ra and the deposition speed are approximately constant.

The ITO film 9 on the substrate 3 obtained by the manufacturing method of this embodiment has also preferable properties like First Embodiment. Moreover, with this manufacturing method in which the ITO film 9 can be also deposited at a room temperature without heating the substrate 3, the ITO film 9 can be deposited on a film including an organic material or on the substrate 3 including an organic material, without damaging the organic material. The substrate 3 having this ITO film 9 deposited thereon can be widely used for a display apparatus such as an LCD and an EL apparatus, a photovoltaic apparatus such as a solar battery and an optical sensor, a semi-conductor apparatus such as a TFT, an optical communication apparatus such as a light modulator and an optical switch, or the like.

It should be noted that, though First and Second Embodiments describe a case where an ITO film 9 is deposited as a transparent conductive film, the invention is not limited to this case and can be applied to, for instance, deposition of a transparent conductive film made of ZnO, $SnO_2$ and the like. In this modified case for First Embodiment, the target 5 is constituted of Zn or Sn, or may be constituted of alloy of Zn and Al for depositing a ZnO film with $Al_2O_3$ doped therein. In the modified case for Second Embodiment, the target 15 is constituted of ZnO or $SnO_2$, or may be constituted of a mixture of ZnO and $Al_2O_3$ for depositing a ZnO film with $Al_2O_3$ doped therein.

The deposition conditions such as the pressure during deposition are not limited the deposition conditions used for explanation in First and Second Embodiments. Moreover, the rare gas lead from the ion gun 7 into the film deposition chamber 1 is not limited to Ar. Furthermore, an apparatus for generating the oxide gas is not limited to the ECR radical source 6, and may be an RF radical source or the like.

Moreover, though Second Embodiment describes a case where oxygen gas is lead into the film deposition chamber 1, the present invention is not limited to this, and oxide gas including oxygen radicals may be lead.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A substrate coated with a transparent conductive film, comprising:
   a substrate; and
   a transparent conductive film including one of metal oxide and alloy oxide, which film is deposited on the substrate, and which film has a mean surface roughness of 0.5 nm or smaller,
   wherein the transparent conductive film is deposited in the following steps of:
      disposing a substrate and a target including one of metal and alloy in a film deposition chamber;
      leading an ion beam of rare gas into the film deposition chamber, to cause collision of the ion beam with the target, sputtering-emission of constitutive atoms of the target, and supply of the emitted atoms to the substrate; and
      leading oxide gas including oxygen radicals as a main element thereof into the film deposition chamber.

2. The substrate coated with a transparent conductive film according to claim 1, wherein the oxide gas is generated through electron cyclotron resonance.

3. The substrate coated with a transparent conductive film according to claim 2, wherein the transparent conductive film is deposited on a film including an organic material, which film is deposited on the substrate.

4. The substrate coated with a transparent conductive film according to claim 3, wherein the substrate is a glass substrate.

5. The substrate coated with a transparent conductive film according to claim 4, wherein the transparent conductive film is an indium oxide film with tin doped therein.

6. The substrate coated with a transparent conductive film according to claim 3, wherein the transparent conductive film is an indium oxide film with tin doped therein.

7. The substrate coated with a transparent conductive film according to claim 2, wherein the transparent conductive film is an indium oxide film with tin doped therein.

8. The substrate coated with a transparent conductive film according to claim 1, wherein the transparent conductive film is deposited on a film including an organic material, which film is deposited on the substrate.

9. The substrate coated with a transparent conductive film according to claim 8, wherein the substrate is a glass substrate.

10. The substrate coated with a transparent conductive film according to claim 9, wherein the transparent conductive film is an indium oxide film with tin doped therein.

11. The substrate coated with a transparent conductive film according to claim 8, wherein the transparent conductive film is an indium oxide film with tin doped therein.

12. The substrate coated with a transparent conductive film according to claim 1, wherein the transparent conductive film is an indium oxide film with tin doped therein.

13. A substrate coated with a transparent conductive film, comprising:
   a substrate; and
   a transparent conductive film including one of metal oxide and alloy oxide, which film is deposited on the substrate, and which film has a mean surface roughness of 0.5 nm or smaller,
   wherein the transparent conductive film is deposited in the following steps of:
      disposing a substrate and a target including one of metal oxide and alloy oxide in a film deposition chamber;
      leading an ion beam of rare gas into the film deposition chamber, to cause collision of the ion beam with the target, sputtering-emission of ones of atoms and molecules constituting the target, and supply of the emitted ones of atoms and molecules to the substrate; and
      leading oxide gas including one of oxygen gas and oxygen radicals as a main element thereof into the film deposition chamber.

14. The substrate coated with a transparent conductive film according to claim 13, wherein the oxide gas is generated through electron cyclotron resonance.

* * * * *